US009468126B2

(12) United States Patent
Pronozuk et al.

(10) Patent No.: US 9,468,126 B2
(45) Date of Patent: Oct. 11, 2016

(54) MULTI-DEVICE STORAGE ENCLOSURE WITH EXTENDABLE DEVICE SUPPORT SLEDS

(71) Applicant: Seagate Technology LLC, Cupertino, CA (US)

(72) Inventors: Anthony John Pronozuk, Loveland, CO (US); Shawn Jacob Noland, Longmont, CO (US); James Edward Dykes, Longmont, CO (US); William Leon Rugg, Longmont, CO (US); Chau Chin Low, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 207 days.

(21) Appl. No.: 14/076,515

(22) Filed: Nov. 11, 2013

(65) Prior Publication Data

US 2014/0362515 A1    Dec. 11, 2014

Related U.S. Application Data

(60) Provisional application No. 61/833,635, filed on Jun. 11, 2013.

(51) Int. Cl.
*H05K 7/14* (2006.01)

(52) U.S. Cl.
CPC .......... *H05K 7/1488* (2013.01); *H05K 7/1487* (2013.01); *H05K 7/1491* (2013.01)

(58) Field of Classification Search
CPC . H05K 7/1488; H05K 7/1487; H05K 7/1491
See application file for complete search history.

(56) References Cited

U.S. PATENT DOCUMENTS

| 3,977,756 | A | * | 8/1976 | Rodondi | H01R 12/62 439/357 |
| 5,443,312 | A | * | 8/1995 | Schluter | H05K 7/1488 312/201 |
| 6,137,759 | A | * | 10/2000 | Ogiro | G11B 17/0466 720/640 |
| 6,459,571 | B1 | | 10/2002 | Carteau | |
| 6,496,366 | B1 | | 12/2002 | Coglitore et al. | |
| 6,551,113 | B1 | * | 4/2003 | Nishiyama | H01R 12/79 439/67 |
| 6,772,887 | B2 | * | 8/2004 | Audibert | G02B 6/4455 211/26 |
| 6,854,605 | B2 | * | 2/2005 | Wrycraft | H05K 7/1491 211/187 |
| 7,305,458 | B2 | | 12/2007 | Hsue et al. | |
| 7,418,623 | B2 | | 8/2008 | Elliott et al. | |
| 7,536,586 | B2 | | 5/2009 | Ahmadian et al. | |
| 7,568,122 | B2 | | 7/2009 | Mechalke et al. | |
| 7,877,626 | B2 | | 1/2011 | Piszczek et al. | |
| 8,010,713 | B2 | | 8/2011 | Matumura et al. | |
| 8,014,144 | B2 | * | 9/2011 | Cheng | G06F 1/187 361/679.33 |

(Continued)

*Primary Examiner* — Courtney Smith
*Assistant Examiner* — Keith Depew
(74) *Attorney, Agent, or Firm* — Hall Estill Attorneys at Law

(57) ABSTRACT

Apparatus for retracting and extending sets of operational processing devices in a multi-device enclosure. In accordance with some embodiments, an enclosed housing is provided with opposing first and second ends. Sleds are individually movable between a retracted position within the enclosed housing and an extended position in which the sled projects from the first end. Each sled supports a group of processing devices. A control board is disposed within the enclosed housing adjacent the second end. A plurality of flex circuits contactingly engage the processing devices to provide communication paths between the processing devices and the control board in both the retracted and extended positions of the sleds.

20 Claims, 13 Drawing Sheets

(56) References Cited

U.S. PATENT DOCUMENTS

| | | | |
|---|---|---|---|
| 8,120,922 B2* | 2/2012 | Randall | G11B 33/126 361/725 |
| 8,191,841 B2* | 6/2012 | Jeffery | G11B 33/02 165/104.13 |
| 8,296,406 B2 | 10/2012 | Kasperson et al. | |
| 8,787,012 B2* | 7/2014 | Michael | G06F 1/187 361/679.34 |
| 9,095,070 B2* | 7/2015 | Ross | G11B 33/128 |
| 9,148,980 B2* | 9/2015 | Moss | G06F 1/20 |
| 2003/0082941 A1* | 5/2003 | Kuller | H01R 13/629 439/160 |
| 2003/0227753 A1* | 12/2003 | Wrycraft | H05K 7/1491 361/727 |
| 2006/0171110 A1* | 8/2006 | Li | G06F 1/184 361/679.37 |
| 2007/0045479 A1* | 3/2007 | Nguyen | H05K 7/1491 248/49 |
| 2007/0070595 A1* | 3/2007 | Chen | G06F 1/187 361/679.37 |
| 2007/0227756 A1* | 10/2007 | Doerr | H05K 7/1491 174/69 |
| 2007/0230110 A1* | 10/2007 | Starr | G11B 33/10 361/679.31 |
| 2009/0231800 A1 | 9/2009 | Franz et al. | |
| 2010/0110628 A1* | 5/2010 | Barrenechea | G06F 1/183 361/679.48 |
| 2011/0100933 A1* | 5/2011 | Kitten | F16L 3/015 211/1 |
| 2012/0012714 A1* | 1/2012 | Rubenstein | H02G 3/0456 248/68.1 |
| 2012/0325127 A1 | 12/2012 | Adrain | |
| 2013/0050963 A1* | 2/2013 | Zhou | H02G 11/006 361/752 |
| 2013/0077219 A1* | 3/2013 | Fu | H02G 11/006 361/679.02 |
| 2013/0151769 A1 | 6/2013 | Childs et al. | |
| 2013/0161277 A1* | 6/2013 | Augsburger | H05K 7/1487 211/175 |
| 2013/0219101 A1 | 8/2013 | Hansen et al. | |
| 2013/0286626 A1* | 10/2013 | Chen | H05K 7/183 361/809 |
| 2013/0341471 A1* | 12/2013 | Yang | H05K 7/1491 248/70 |
| 2014/0153186 A1* | 6/2014 | Liu | H05K 7/1491 361/679.58 |
| 2014/0158834 A1* | 6/2014 | Chen | H05K 7/1421 248/68.1 |
| 2014/0183306 A1* | 7/2014 | Chen | H05K 7/1421 248/70 |
| 2016/0095246 A1* | 3/2016 | Noland | H05K 7/1489 361/679.31 |
| 2016/0150667 A1* | 5/2016 | Xu | H05K 7/1489 361/679.4 |

* cited by examiner

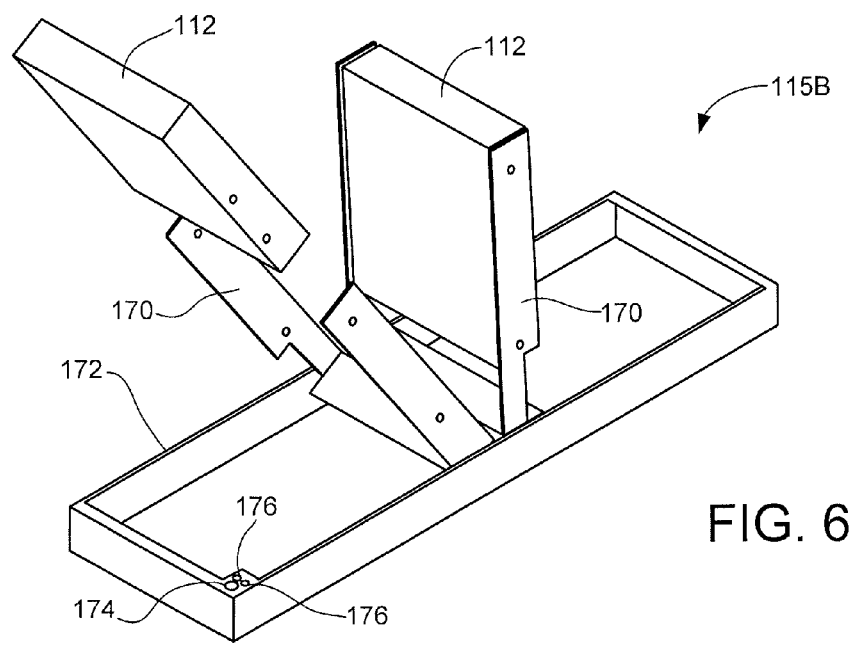
FIG. 6
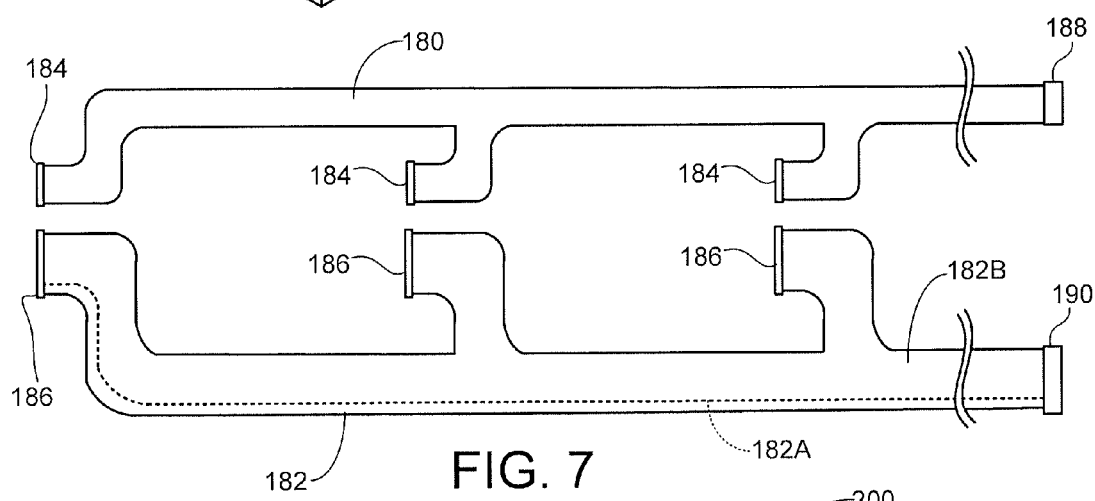
FIG. 7
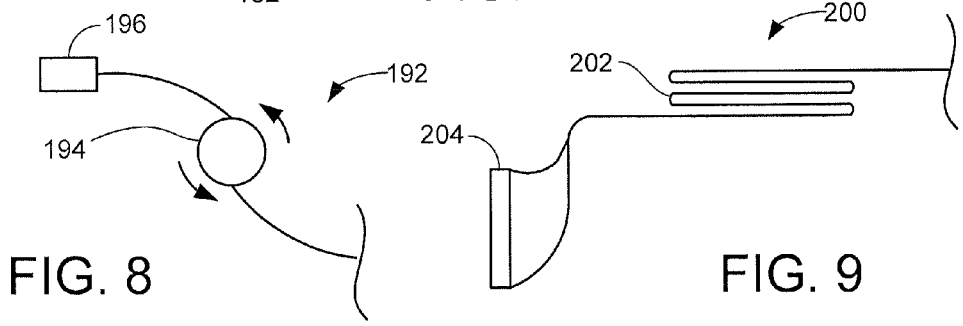
FIG. 8
FIG. 9

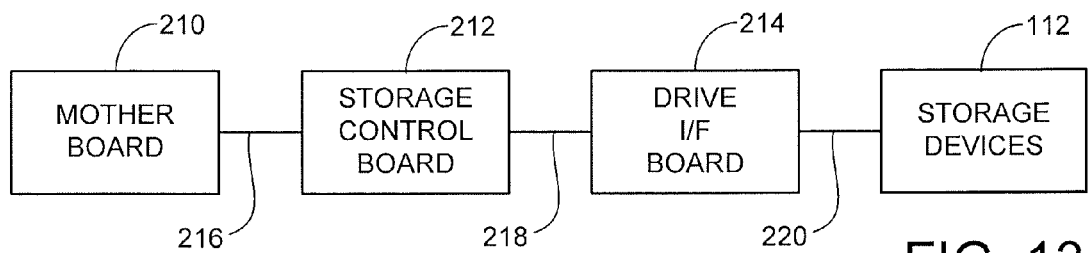
FIG. 13
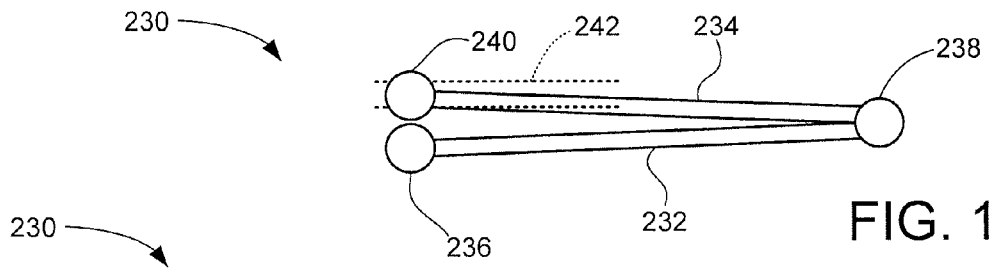
FIG. 14A
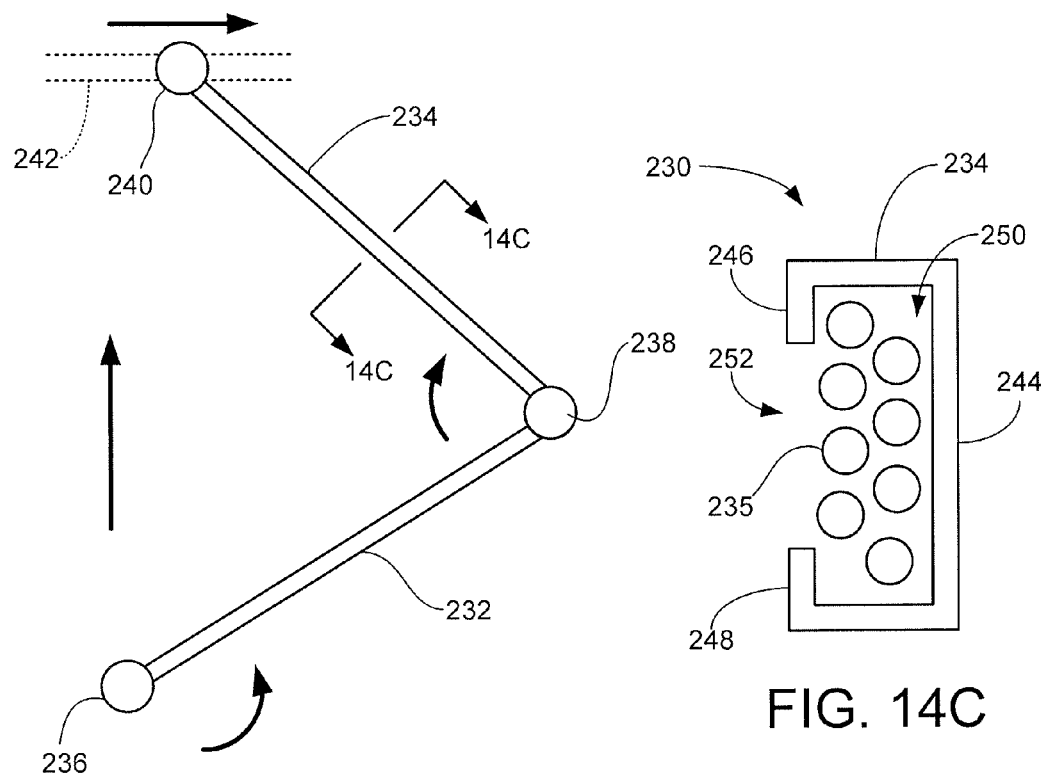
FIG. 14B
FIG. 14C

MULTI-DEVICE STORAGE ENCLOSURE WITH EXTENDABLE DEVICE SUPPORT SLEDS

RELATED APPLICATION

The present application makes a claim of domestic priority to U.S. Provisional Patent Application No. 61/833,635 filed Jun. 11, 2013, the contents of which are hereby incorporated by reference.

SUMMARY

Various embodiments of the present disclosure are generally directed to an apparatus for retracting and extending sets of operational processing devices in a multi-device enclosure.

In accordance with some embodiments, an enclosed housing is provided with opposing first and second ends. Sleds are individually movable between a retracted position within the enclosed housing and an extended position in which the sled projects from the first end. Each sled supports a group of processing devices. A control board is disposed within the enclosed housing adjacent the second end. A plurality of flex circuits contactingly engages the processing devices to provide communication paths between the processing devices and the control board in both the retracted and extended positions of the sleds.

BRIEF DESCRIPTION OF THE DRAWINGS

FIG. 6 is another alternative embodiment for the sled of FIG. 4.

FIG. 7 depicts flex circuits that can be used to interconnect the storage devices in the storage enclosures of FIG. 1.

FIG. 8 depicts a retractable flex circuit that can be used to interconnect the storage devices.

FIG. 9 depicts an accordion folded flex circuit that can be used to interconnect the storage devices.

FIG. 13 is another functional block representation of aspects of the storage enclosures.

FIGS. 14A-14C depict a hinge arm carrier that supports one or more flex circuits in accordance with some embodiments.

DETAILED DESCRIPTION

Figure 1:
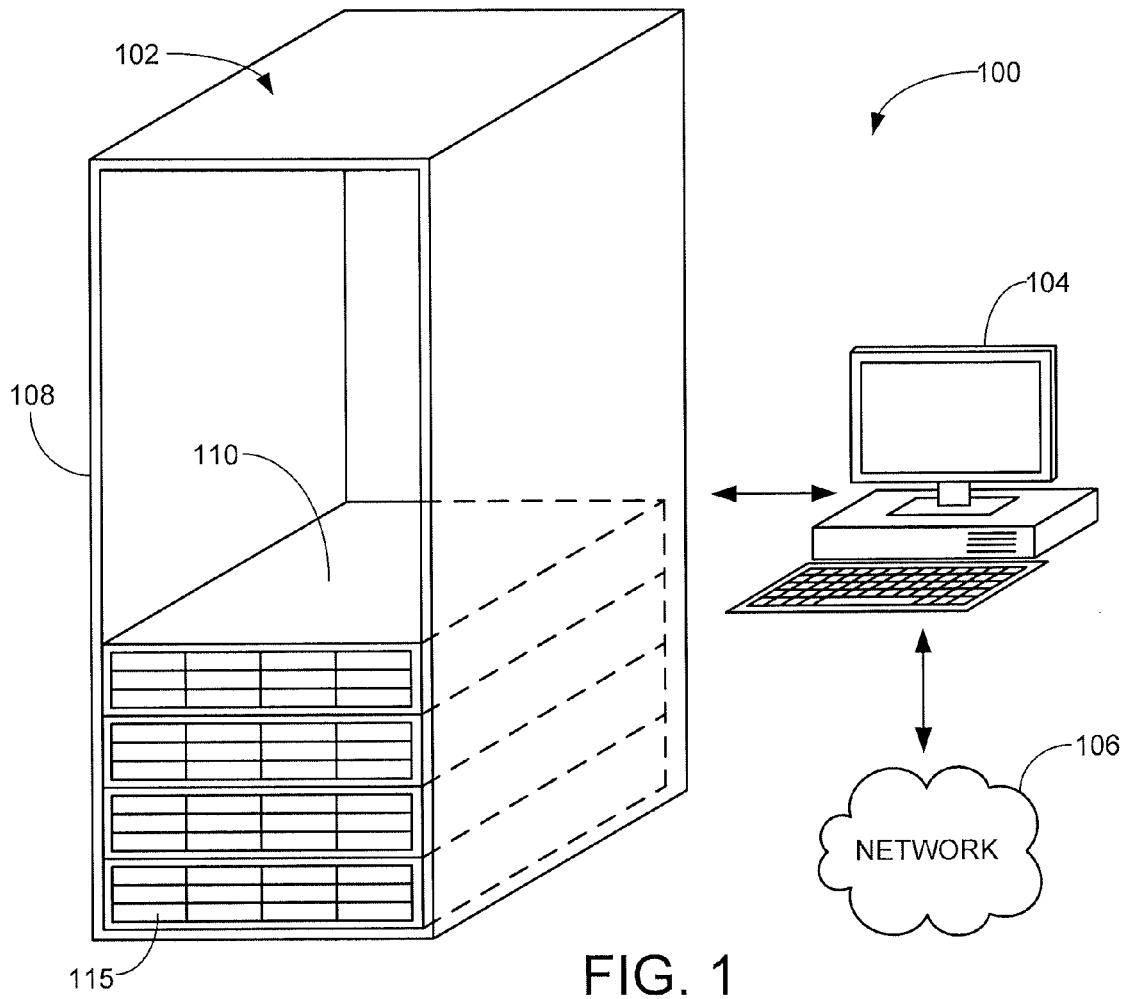
FIG. 1 is a functional representation of a mass storage system with a number of storage enclosures in accordance with some embodiments.

The present disclosure generally relates to an enclosure configuration that facilitates hot swapping of processing devices within the enclosure. The various embodiments can be implemented in a networked mass storage enclosure with a plurality of data storage devices, or other processing environments. In some cases, the processing environment may be a distributed object storage system for a cloud computing environment.

Mass storage systems often employ multiple data storage devices which are operationally arranged to provide a relatively large data capacity memory storage space. The devices may be grouped together into a storage enclosure or other module that can be removably installed into a rack system (e.g., a server cabinet, etc.).

Mass storage systems can take a variety of forms including servers, cloud storage modules, RAID (redundant array of independent discs) systems, object storage, extended memory systems (JBODs, or "just a box of drives"), point-to-point link systems, etc. The storage systems can be accessed locally or over a network including a local area network (LAN), a wide area network (WAN), the Internet, etc.

While operable to provide highly efficient computer storage, existing storage systems can be subject to a variety of limitations including the inability to remove and replace individual storage devices while maintaining the storage enclosure in a powered, operational condition ("hot swapping").

Accordingly, various embodiments of the present disclosure are generally are directed to an apparatus and method for hot swapping individual processing devices within a multi-device storage enclosure. As explained below, in some embodiments a storage enclosure has a housing adapted to be mounted within a rack system between a cold aisle (front) and a warm aisle (back). The housing supports a number of components including multiple storage devices, fans, power supplies, control boards, etc.

Sets of the storage devices are mounted within retractable and extendable sleds, or trays, that are accessible from a single side of the storage enclosure such as the front (cold aisle) of the storage enclosure. Electrical interconnections with the storage devices are carried out via flexible conductive paths (referred to herein as "flex circuits"). This allows the individual sleds to be extended from the storage enclosure housing while the storage devices remain powered and in an operational state. One or more individual storage devices can be removed and replaced from an extended sled while the remaining storage device or devices remain powered and operational.

In some cases, a sled having multiple operational storage devices can be extended from a storage enclosure. At least one of the storage devices can be deactivated, removed and replaced with a new, replacement storage device while one or more of the remaining multiple operational storage devices in the sled remain in an operational state to service data access (e.g., read and write) operations with a host. The sled can then be retracted back into the storage enclosure.

The flex circuits can take a variety of forms, such as planar flex circuits (conductive traces on a flexible insulative backing layer), flexible wires, cables, jacketed cables, ribbon cables, etc. The flex circuits are arranged to maintain continuous electrical and mechanical interconnection with each of the multiple storage devices in each sled so that the non-affected storage devices continue to operate irrespective of whether the associated sled is extended or retracted.

In this way, service operations such as replacements and upgrades can be carried out from a selected side of the storage enclosures, such as from the cold aisle side of a storage facility, without the need to take the storage devices to an off-line and/or powered down condition. It is also generally unnecessary to remove the storage enclosure from the server cabinet or other installation location. As desired, individual device electronics such as indicator lights (LEDs, etc.), power switches, etc. can be provided for each device and incorporated into the sleds and/or the housing to allow user selection and control of individual storage devices.

While data storage devices are a particularly useful type of processing device to which the various techniques discussed herein can be applied, it will be appreciated that other processing devices, such as electronic systems, controllers, boards, operational modules, etc. can also benefit from the various applied techniques and are included within the present disclosure.

These and other features can be understood beginning with a review of FIG. 1 which generally depicts a mass storage system 100 in accordance with some embodiments. The system 100 includes a storage assembly 102 coupled to a computer 104 which in turn is connected to a network 106. The computer 104 can take a variety of forms such as a work station, a local personal computer, a server, etc. The storage assembly 102 includes a server cabinet (rack) 108 and a plurality of modular storage enclosures 110.

In some embodiments, the storage rack 108 is a 42U server cabinet with 42 units (U) of storage, with each unit comprising about 1.75 inches (in) of height. The width and length dimensions of the cabinet can vary but common values may be on the order of about 24 in.×36 in. Each storage enclosure can be a multiple of the storage units, such as 2U. As explained below, fully populating the rack 108 with storage enclosures 110 can provide well over 1 Petabyte ($10^{15}$ bytes) of storage for the computer 104 and/or network applications.

Figure 2A:
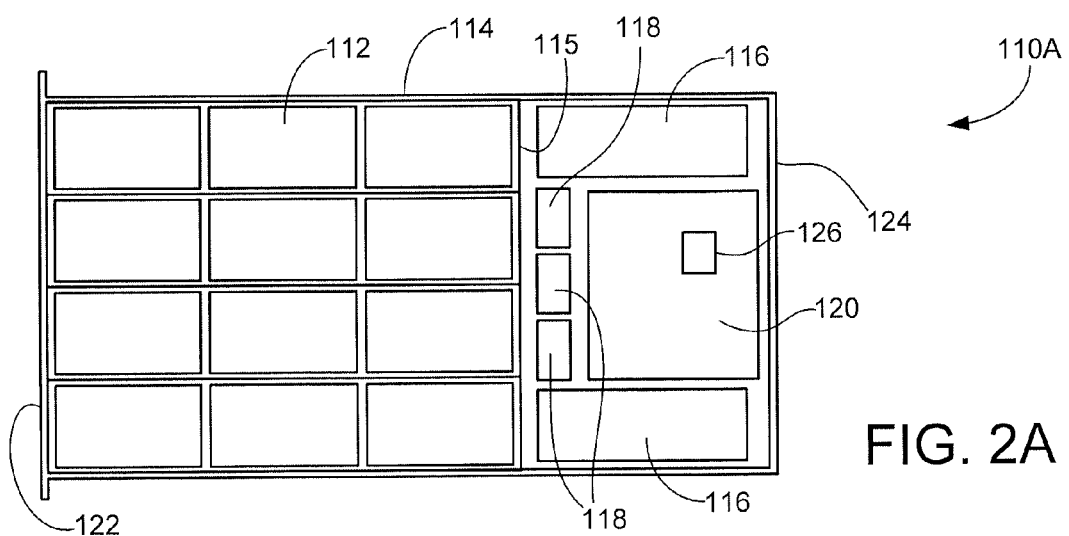
FIGS. 2A-2E show different embodiments of the storage enclosures of FIG. 1.

A number of example configurations for the storage enclosures 110 are set forth in FIGS. 2A-2E. For reference, like reference numerals are used to describe similar components. A first storage enclosure 110A is represented in FIG. 2A. The configuration in FIG. 2A is a 36/2U configuration with 36 (3×4×3) data storage devices 112 in a 2U form factor height housing 114. A variety of other configurations can be used including storage enclosures with a total of N drives where N=12, 16, 20, 24, 30, 32, 48, etc. Sleds 115 can be used to secure multiple sets of the storage devices 112. The sleds 115 each support three (1×3) storage devices 112, and can be individually extended and retracted from the front of the housing 114 in a manner to be explained in greater detail below.

The storage enclosure 110A includes dual power supplies 116, multiple airflow fans 118 and at least one controller board 120. The power supplies 116 provide electrical power for the storage enclosures 110. The fans 118 draw airflow from openings (not separately shown) in a front facing side 122 of the housing 114 and pull the airflow through the housing and out openings (not shown) in a rear facing side 124 of the housing.

The controller 120 may have one or more intelligent processors 126 and can take a variety of configurations including but not limited to a server, a controller (including dual redundant RAID controllers), a cloud controller, dual port controllers, an Ethernet drive controller, etc. Other support electronics and components can be provided in the storage enclosure 110A as well, including a boot storage memory device, storage control boards, device interface (I/F) boards, wiring cables, switches, brackets, LED indicators, etc. A redundant design may be provided so that substantially any failed component can be replaced while maintaining the storage enclosure 110A in an operational condition.

Figure 2B:
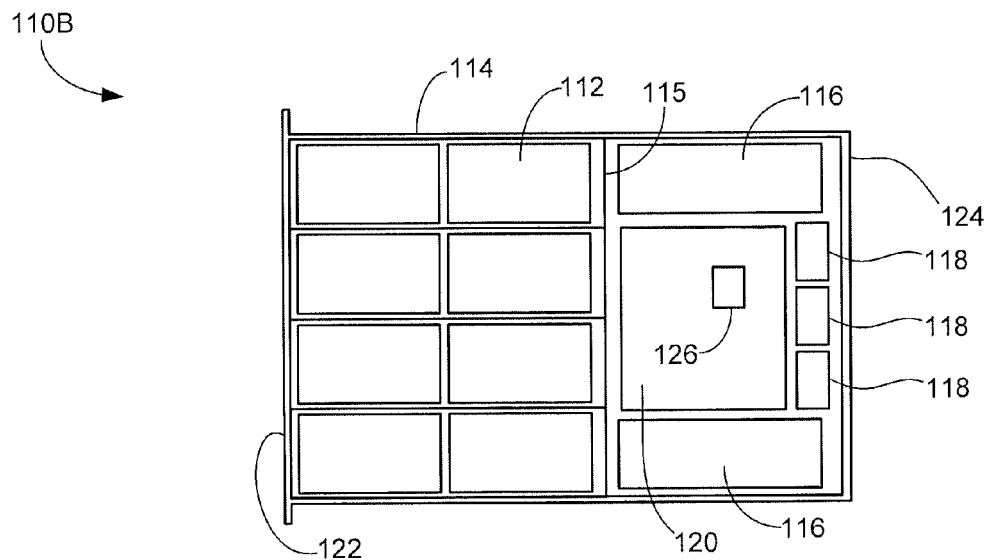
Figure 2C:
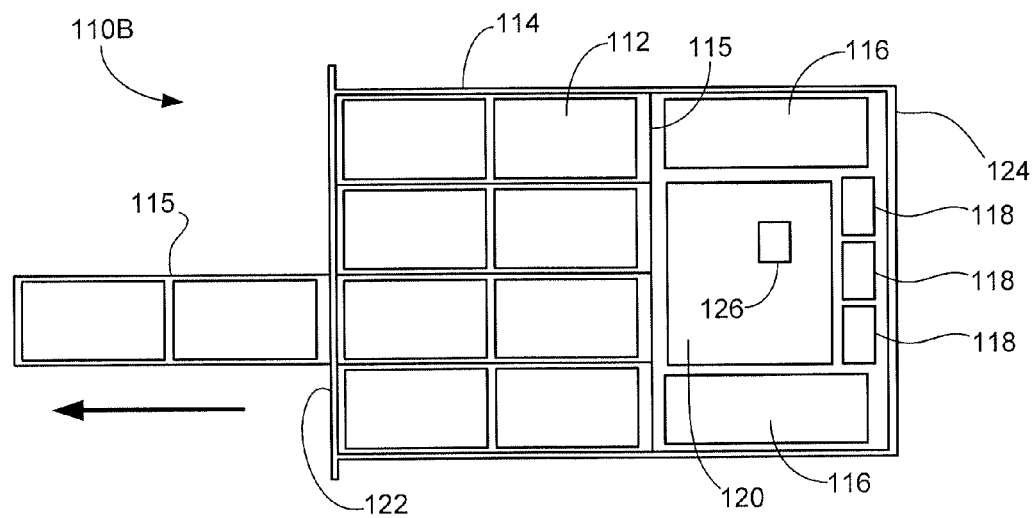

An alternative configuration for the storage enclosures is shown at 110B in FIGS. 2B-2C. The enclosure 110B has a 32/3U configuration with 32 (4×4×2) storage devices arranged into 1×2 sleds 115. The sleds 115 can be individually extended and retracted as depicted in FIG. 2C. The sizes, shapes, locations and configurations of the various power supplies 116, fans 118 and control board(s) 120 can vary as required.

Figure 2D:
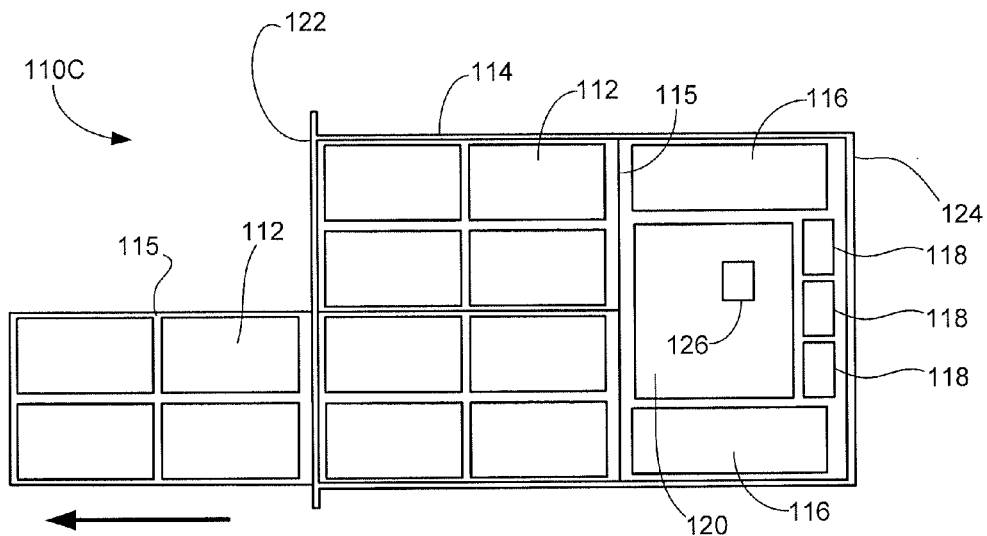

FIG. 2D provides a storage enclosure 110C similar to the storage enclosure 110B. The storage enclosure 110C has a 32/3U configuration with 32 (4×4×2) storage devices 112 arranged into 2×2 sleds 115 so that the storage devices 112 are extended four at a time. The sleds can be individually extended and retracted as before.

Figure 2E:
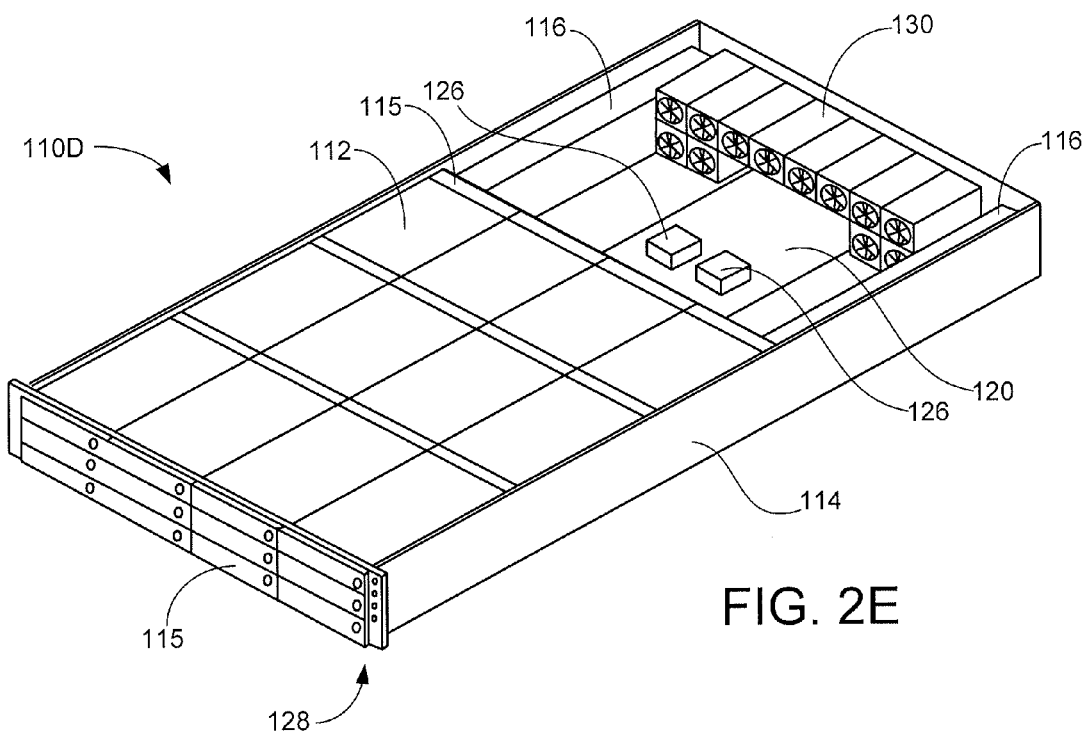

FIG. 2E provides a storage enclosure 110D having a 36/2U configuration with 36 (4×3×3) storage devices 112 arranged into 1×3 sleds 115. Sled electronics provide LED lights 128 to indicate the status of the devices in each sled 115. Smaller, high velocity fans are depicted at 130. It will be appreciated that other arrangements for the storage enclosures can be employed as desired.

Figure 3:
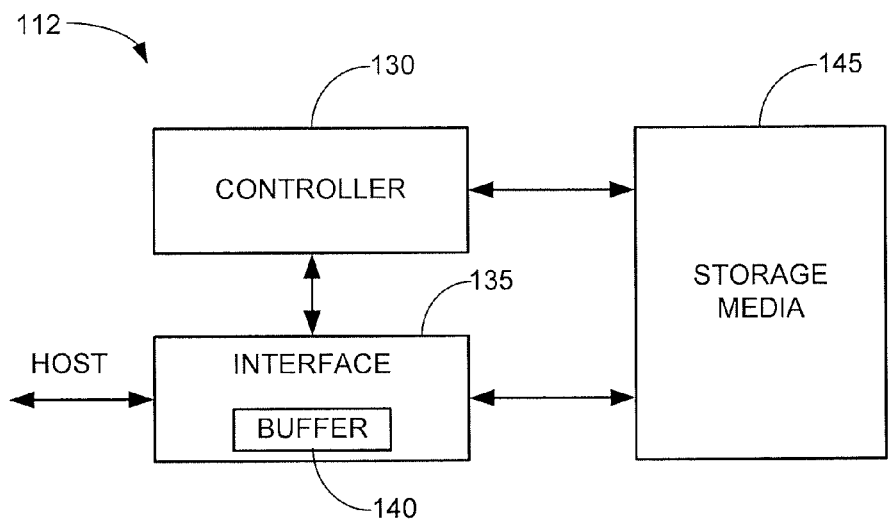
FIG. 3 is a functional block representation of a selected data storage device from FIGS. 2A-2E.

The storage devices 112 can take a variety of processing device configurations, such as but not limited to a hard disc drive (HDD), a solid state drive (SSD), a hybrid drive (solid state hybrid drive, SDHD), etc. FIG. 3 is a functional block diagram for a generalized data storage device 112 in accordance with some embodiments. The data storage device 112 includes a programmable controller 130, an interface circuit 135 with a data buffer 140 and storage media 145. The controller 130 directs data transfers between the storage media 145 and a host device, such as the controller 104 in FIG. 1.

In the context of an HDD, the storage media 145 may take the form of one or more axially aligned magnetic recording discs which are rotated at high speed by a spindle motor. Data transducers can be arranged to be controllably moved and hydrodynamically supported adjacent recording surfaces of the storage disc(s). While not limiting, in some embodiments the storage devices 112 are 3½ inch form factor HDDs with nominal dimensions of 5.75 in×4 in×1 in.

In the context of an SSD, the storage media 145 may take the form of one or more flash memory arrays made up of non-volatile flash memory cells. Read/write/erase circuitry can be incorporated into the storage media module to effect data recording, read back and erasure operations. Other forms of solid state memory can be used in the storage media including magnetic random access memory (MRAM), resistive random access memory (RRAM), spin torque transfer random access memory (STRAM), phase change memory (PCM), in-place field programmable gate arrays (FPGAs), electrically erasable electrically programmable read only memories (EEPROMs), etc.

In the context of a hybrid (SDHD) device, the storage media 145 may take multiple forms such as one or more rotatable recording discs and one or more modules of solid state non-volatile memory (e.g., flash memory, etc.). Other configurations for the storage devices 112 are readily contemplated, including other forms of processing devices besides devices primarily characterized as data storage devices, such as computational devices, circuit cards, etc. that at least include computer memory to which secure erasure processing is applied.

Figure 4:
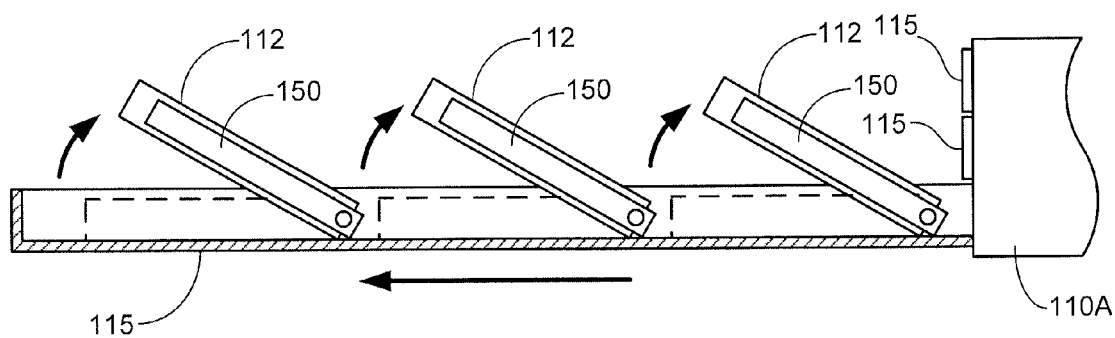
FIG. 4 depicts a multi-device sled of the enclosure of FIG. 1 in an extended position to permit access to the storage devices supported by the sled.

FIG. 4 depicts a selected multi-drive sled 115 from FIG. 2A in an extended position. The 36/2U configuration has a total of 12 sleds (see e.g., FIG. 1) each of which can be individually extended and retracted as required. The sleds 115 allow failed/powered down devices 112 to be removed and replaced without the need to power down the other devices 112 within the enclosure 110A and in the same sled 115.

The sled 115 in FIG. 4 includes u-shaped supports 150 which support the individual devices 112 and allow the devices to be rotated upwardly as shown. Fasteners in the form of spring biased pins or other mechanisms (not separately shown) can be used to secure and release the devices 112 without the need for tools. The devices can rotate in the same or different directions.

Figure 5:
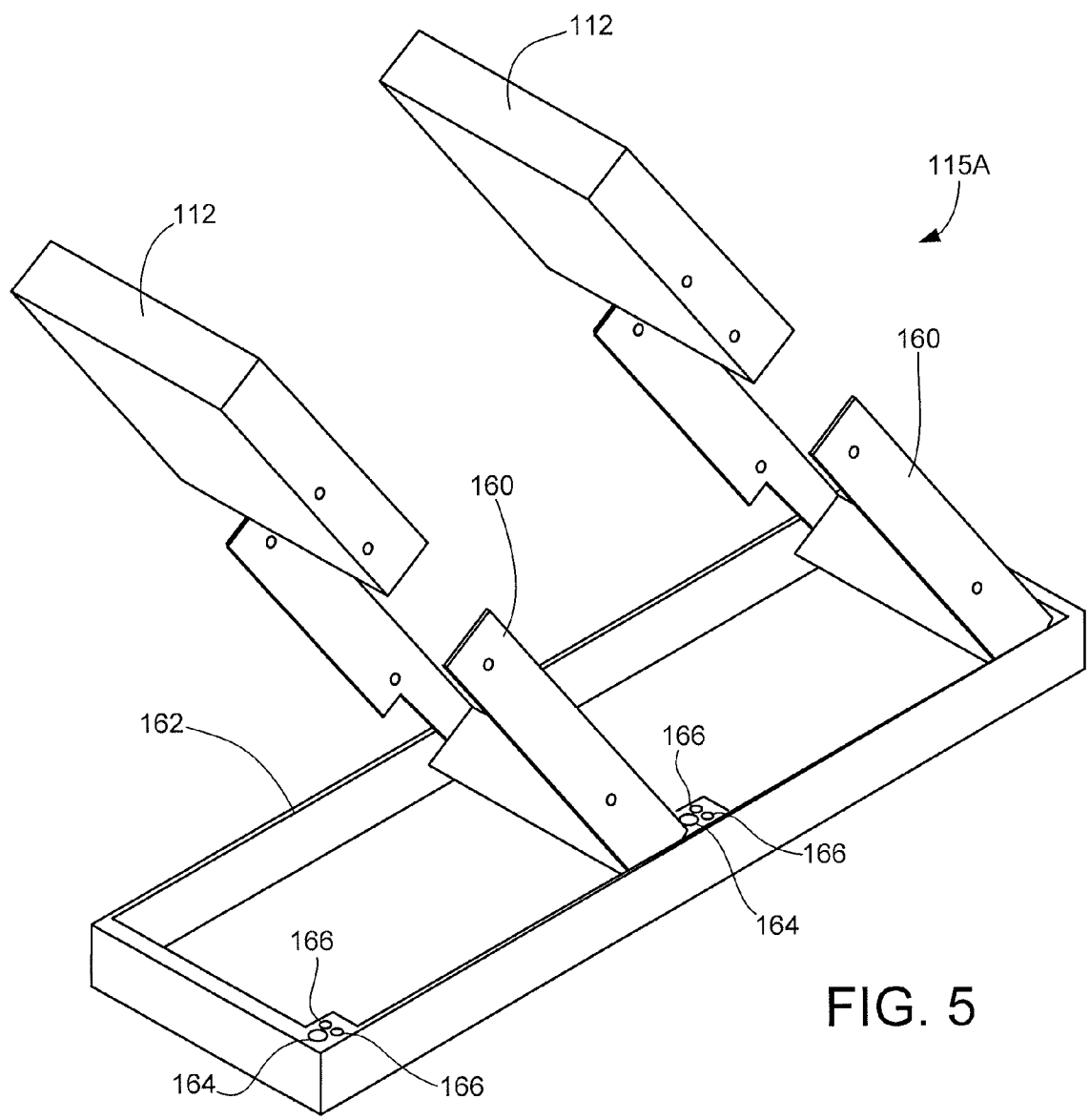
FIG. 5 is an alternative embodiment for the sled of FIG. 4.

FIG. 5 is an exploded representation of another sled 115A similar to the sled 115 in FIG. 5. The sled 115A has u-shaped supports 160 and a tray housing 162 with a substantially rectangular, open box configuration. The tray housing 162 accommodates two storage devices 112. The u-shaped supports 160 both rotate in the same direction to facilitate access to the devices, although such is not required. Detent features (not separately shown) can temporarily "lock" the rotated supports 160 in the upward direction at a suitable angle, such as about 45 degrees. As desired, the sled 115A can include device electronics including a power button 164 and LED lights 166.

FIG. 6 illustrates another sled 115B similar to the sled 115A in FIG. 5. The sled 115B places the storage devices 112 "back-to-back" so that u-shaped supports 170 within a tray housing 172 rotate opposing directions from a medial portion of the tray housing. A feature of the arrangement of FIG. 7 is that the connection cables can be centrally located to engage the respective devices 112.

The sleds can be retracted automatically or manually. For example, the sleds can have a rail and roller mechanism similar to a "drawer" support used in a dresser or desk to allow the sleds to extend from the enclosure, and a spring-biased locking/unlocking release mechanism so that a user can press a facing surface 172 of the sled in, allowing the sled to pop out a short distance and enabling the user to grasp the front of the sled and retract it from the housing 114. In other embodiments, a motor driven carriage (not separately depicted) can be used to drive the sled to an open position, in a manner similar to an optical disc tray in a personal computer. Extension and retraction of the sleds can additionally/alternatively be carried out via commands entered by the user in the local computer 104 (FIG. 1).

It will be noted that rail kits are known in the art to enable entire storage enclosures to be extended and retracted relative to a server cabinet; such kits can be used in accordance with the storage enclosures 110 of the present disclosure to allow extension thereof from the server cabinet 108 (see FIG. 1). Such extension capabilities at the storage enclosure level may be unnecessary, however, due to the accessibility to the storage devices 112 supplied by the extendable sleds 115.

A flex circuit arrangement can be used to enable the sleds to be extended and retracted while maintaining the devices 112 in a powered up, connected condition. FIG. 7 shows one arrangement in which multi-device flex circuits 180, 182 are routed to each of the devices 112 in a given sled. The flex circuit 180 can be configured to supply electrical power to the devices (e.g., +5V, −5V, +12V, ground, etc.) and the flex circuit 182 can be configured to provide communication paths for the devices in accordance with a selected interface protocol (e.g., SATA, SAS, etc.). In other arrangements, a combined flex circuit can be used that routes both power and data.

The flex circuits 180, 182 in FIG. 7 are characterized as flexible planar circuits comprising one or more elongated, continuous electrical traces (one depicted in dotted line fashion at 182A) on an insulative, flexible backing layer (depicted at 182B). Single-sided or multi-sided flexible planar circuits can be used, and electronic elements (e.g., integrated circuit packages, etc.) can be mounted on or to the flexible planar circuits as required. Other forms of flex circuits that provide flexibility and extension can be used including cables with individual jackets of insulative material, ribbon cables, etc. All such conductors will be contemplated as comprising flex circuits as used herein.

The flex circuits 180, 182 operate in a manner similar to an "extension cord" in that the devices 112 can be moved while still maintaining power and communication connections with the control board 120 (FIG. 2).

Another feature of the use of the flex circuits 180, 182 is the elimination of a main backplane or other rigid power board to interconnect the various devices 112. This reduces weight, improves interior airflow and cooling pathways, and simplifies the design including allowing for the installation of upgraded devices into the enclosure (including new devices with a different interface). Connectors 184, 186 mate with the devices and connectors 188, 190 interconnect with the control board 120.

The number and placement of the respective device connectors 188, 190 along each flex circuit 180, 182 will depend on the number, position and orientation of the devices 112 in each sled 115. It will be appreciated that the flex circuits may be rotated, folded or otherwise routed for clearance purposes so as to fit within the associated sleds and facilitate retraction and extension thereof while maintaining connection with the devices.

FIG. 8 represents a portion of another flex circuit 192 in which spring-activated retraction mechanisms 194 are used to feed out and retract portions of the flex circuits. A connector 196 mates with an associated device 112 as before.

FIG. 9 depicts another flex circuit 200 in which an accordion fold zone 202 is provided to take up slack and allow extension of the associated device 112 as required. As before, a connector 204 mates with a power and/or interface connection of the associated device 112. As required, the flex circuits for a given sled may incorporate any or all of the features discussed above, as well as other features that will occur to the skilled artisan in view of the present disclosure.

Figure 10:
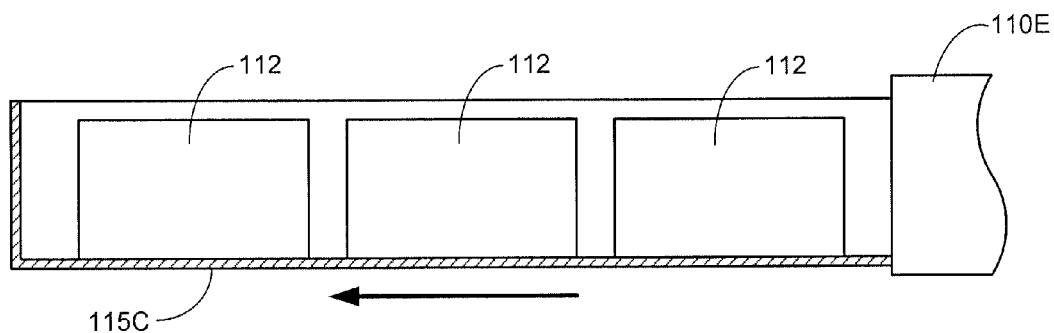
FIG. 10 is another multi-device sled with the storage devices rotated 90 degrees as compared to the orientation of FIG. 4.
Figure 11:
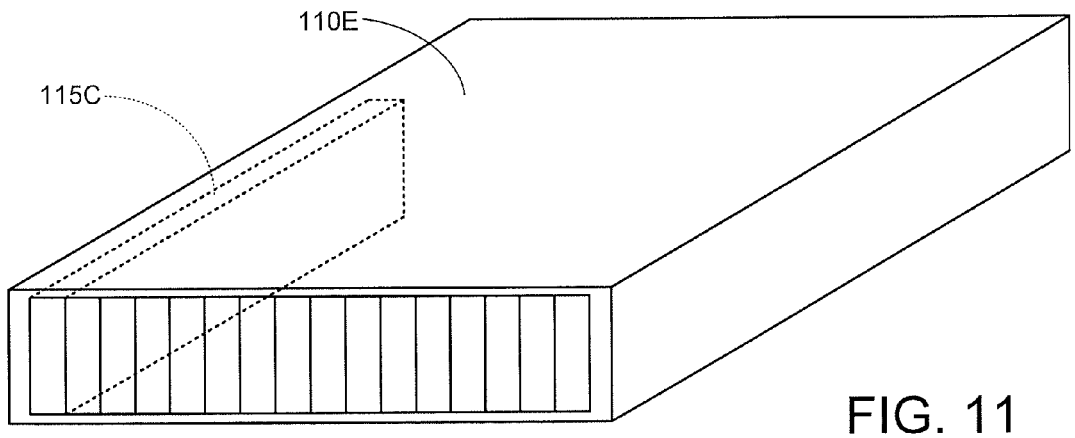
FIG. 11 is an isometric depiction of the storage enclosure of FIG. 10.

FIGS. 10-11 depict another storage enclosure 110E similar to the storage enclosures 110A-110D discussed above in FIGS. 2A-2E. The storage enclosure 110E has a number of storage devices 112 mounted to retractable and extendable sleds 115C. The storage devices 112 are rotated 90 degrees with respect to the orientation of FIGS. 2A-2E, so that the storage devices are on their sides (e.g., arranged vertically rather than horizontally). The various flex circuit solutions discussed above can be readily used with the arrangement of FIGS. 10-11.

Figure 12:
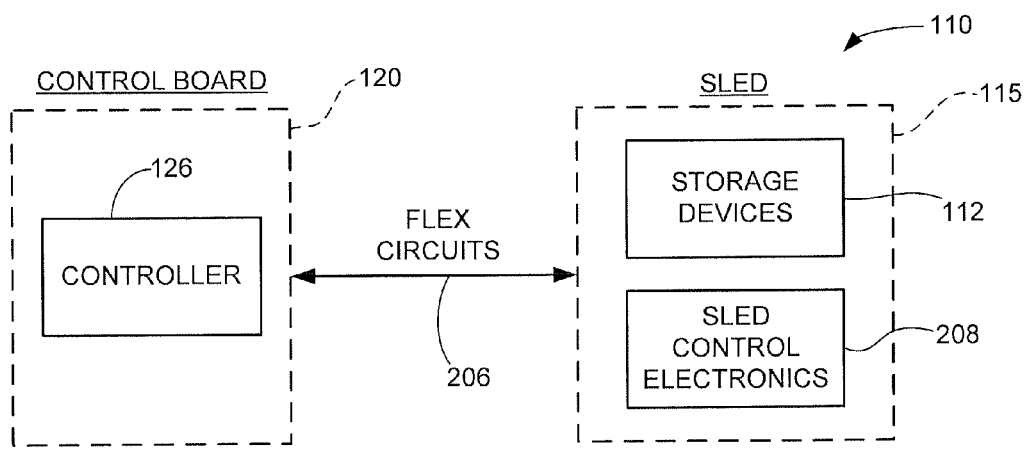
FIG. 12 is a functional block representation of aspects of the storage enclosures of FIG. 1.

FIG. 12 is a functional block representation of aspects of a selected storage enclosure 110 to illustrate one possible interplay between the various elements depicted above. Flex circuits 206 provide electrical interconnection between the controller(s) 126 of the storage enclosure control board 120, the storage devices 112 and the sled control electronics 208 of a given sled 115. Multiple sleds may be powered by a single flex circuit 115 provided the sleds can be individually extended and retracted as discussed above.

FIG. 13 is another functional block representation of aspects of a selected storage enclosure 110 in accordance with further embodiments. The controller functions discussed above may be realized as a motherboard 210, a storage control board 212, and a drive interface (drive I/F) board 214. The storage control board 212 and/or the drive interface board may be plugged into expansion slots available on the motherboard 210 or may be connected using other interconnection mechanisms, including adapters, slots, cables, etc.

A general interconnection between the motherboard 210 and the storage control board 212 is represented by path 216, and the interconnection between the storage control board 212 and the drive I/F board is represented by path 218. In some cases, the three boards 210, 212 and 214 are placed in the rear of the storage enclosure 110 and a flex circuit 220 extends from an associated drive I/F board 214 to each storage device 112. In other cases, the drive I/F boards 214 may be located within the individual sleds 115, in which case the interconnection path 218 may alternatively or additionally be realized as a flex circuit as discussed above.

FIGS. 14A-14C illustrate a hinge arm carrier assembly 230 that may be utilized in to interconnect the various storage devices 112 in each sled 115. For reference, FIG. 14A shows the hinge arm carrier assembly 230 in a retracted position, FIG. 14B shows the hinge arm carrier assembly 230 in an extended position, and FIG. 14C is a cross-sectional depiction of the hinge arm carrier assembly 230 along line 14C-14C from FIG. 14B.

The hinge arm carrier assembly 230 includes at least two rigid hinge arms 232, 234 adapted to secure one or more flex cables 235 (see FIG. 14C). The hinge arms 232, 234 serve as protective "carriers" along which the respective flex cables are internally or externally routed.

The hinge arms 232, 234 can be articulated via joint members 236, 238 and 240. This allows extension of the distal joint member 240 as depicted in FIG. 14B. The base joint member 236 may be secured to the enclosure housing 114 (see e.g., FIG. 2A) and allowed to rotate. The intermediate joint member 238 may be configured as an elbow joint to allow the respective arms 232, 234 to independently rotate. The distal joint member 240 may be arranged to rotate and translate within a rail 242 (shown in broken line fashion) affixed to the rear portion of the associated sled.

In this way, the hinge arm carrier assembly 230 folds in a substantially flat condition when the sled 115 is retracted (FIG. 14A), and opens to the extended position (FIG. 14B) as the sled 115 is extended. While two hinge arms 232, 234 are shown, it will be understood that any suitable number of hinge arms, including more than two, can be used depending on space requirements and extension distances.

FIG. 14C shows the hinge arm 234 to have a generally c-shaped cross-sectional shape with a main web 244 between opposing retention flanges 246, 248. This forms an interior channel 250 with opening 252 to permit insertion of the individual flex circuits 235 (which are depicted as jacketed cables). A planar flex circuit as depicted in FIG. 7 could be alternatively inserted into the channel 250, and/or affixed to the outside surface of the main web 244. Other routing arrangements will occur to the skilled artisan in view of the present disclosure so that the arrangement of FIG. 14C is merely exemplary. It will be appreciated that the individual flex circuits 235 are routed adjacent and/or through the various joint members but such routing has been omitted for clarity.

Figure 15:
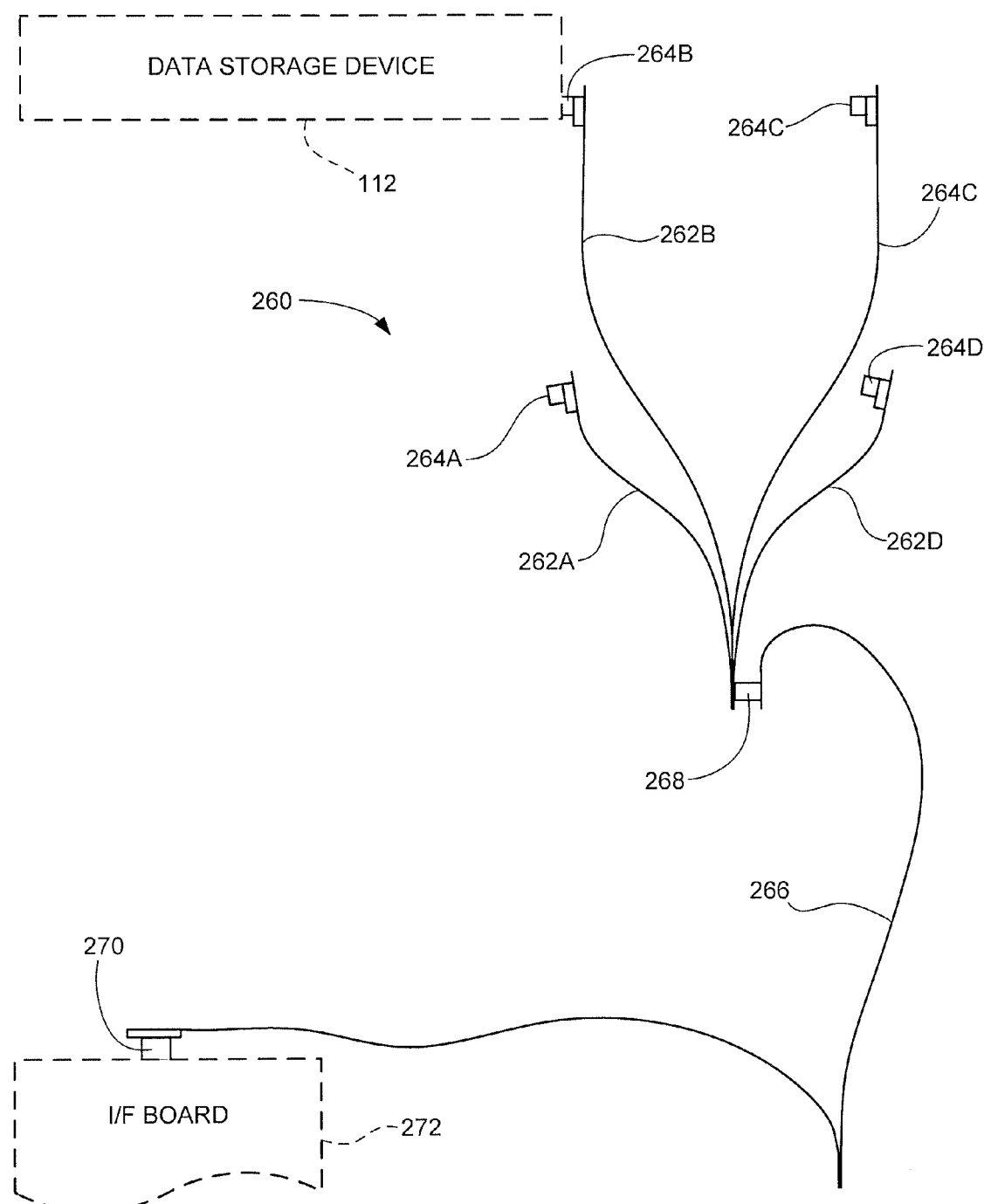
FIG. 15 is a schematic depiction of another flex circuit that can be used to interconnect the storage devices.

FIG. 15 illustrates another flex circuit 260 in accordance with some embodiments. The flex circuit 260 operates as discussed above to supply communication signals and/or electrical power to the respective data storage devices in each sled. While not limiting, it is contemplated that the flex circuit 260 is adaptable for use with the arrangement of FIG. 2D in which 2×2 storage devices 112 are provisioned on each sled 115.

The flex circuit 260 comprises four (4) flex circuit segments 262A, 262B, 262C and 262D each terminating in a connector 264A, 264B, 264C and 264D adapted to physically interconnect with a corresponding connector on a respective data storage device 112. The flex circuit segments are contemplated as comprising flexible insulative substrates on which a series of spaced apart conductive traces are formed. The flex circuit segments may be single sided, double sided, laminated (multi-layer), etc. and may support control circuitry (not separately shown).

The flex circuit segments 262A, 262B, 262C and 262D are mechanically and electrically connected to a flex circuit extension 266 by way of an intervening interconnection member 268. The flex circuit extension 266 also comprises a flexible insulative substrate on which a series of spaced apart conductive traces are formed. The flex circuit extension 266 terminates at a connector 270 which physically interconnects with a corresponding connector on an I/F board 272 or other control signal mechanism.

Figure 16:
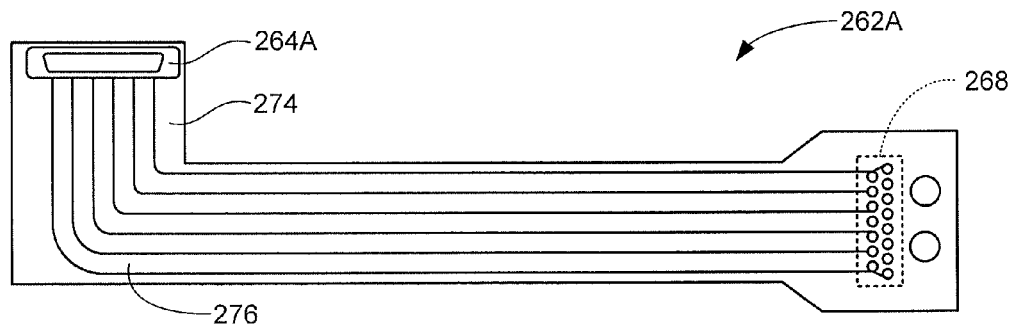
FIG. 16 is a plan representation of a selected flex circuit segment from FIG. 15.

FIG. 16 shows the flex circuit segment 262A in greater detail. A flexible insulative backing layer 274 supports a series of conductive traces denoted generally at 276. The flex circuit segment 262A is provided with a 90 degree turn, but such is merely exemplary and not limiting. Any suitable routing configuration can be used.

The flex circuit segment 262D from FIG. 15 is nominally identical to the segment 262A, and these two segments 262A, 262D are relatively shorter to accommodate the closer pair of the data storage devices 112 of the sled 115. The remaining two segments 262B, 262C are relatively longer to reach the farther pair of the data storage devices 112 of the sled 115 but otherwise take a similar form to that shown in FIG. 16. It will be noted that the respective lengths and shapes of the various flex circuit segments can vary as required.

Figure 17A:
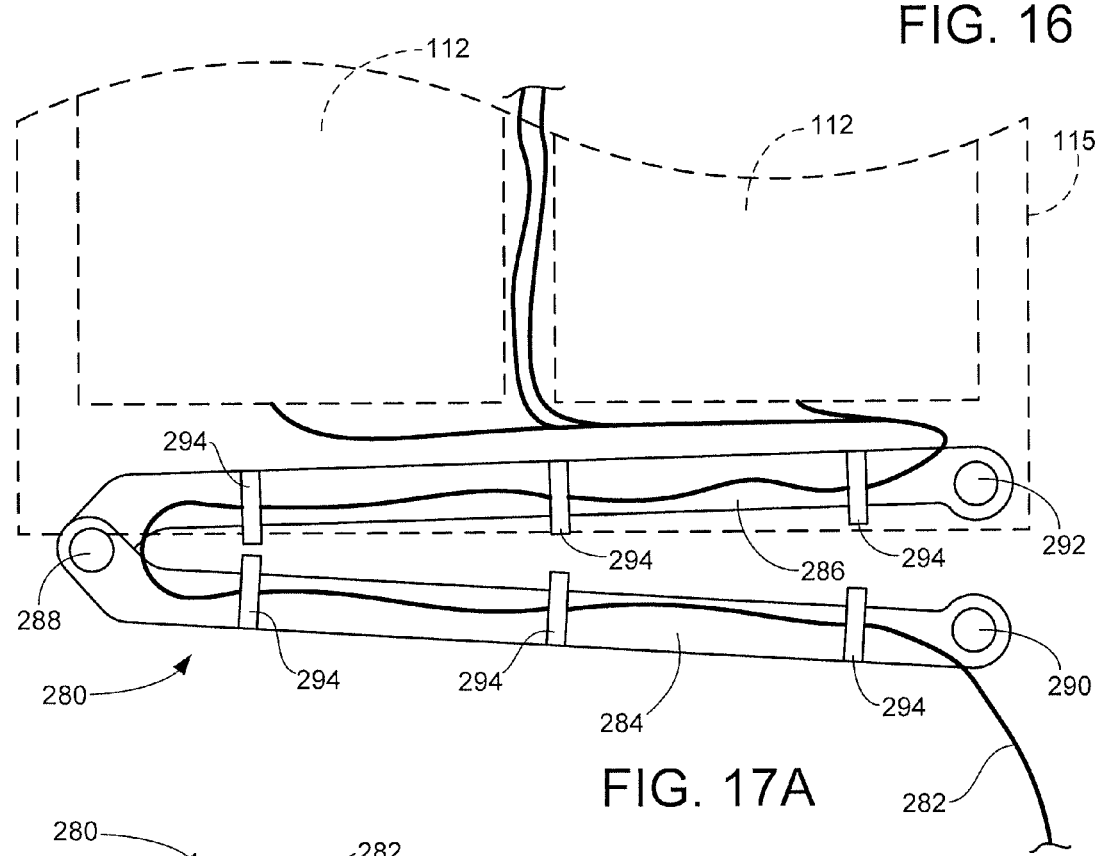
FIGS. 17A-17C are schematic depictions of another hinge arm carrier in accordance with some embodiments.
Figure 17C:
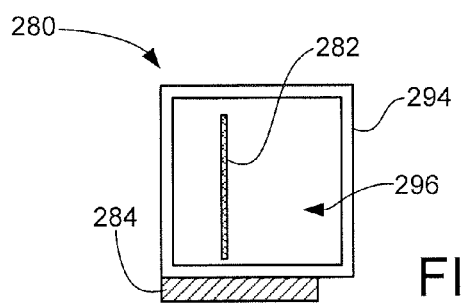
Figure 17B:
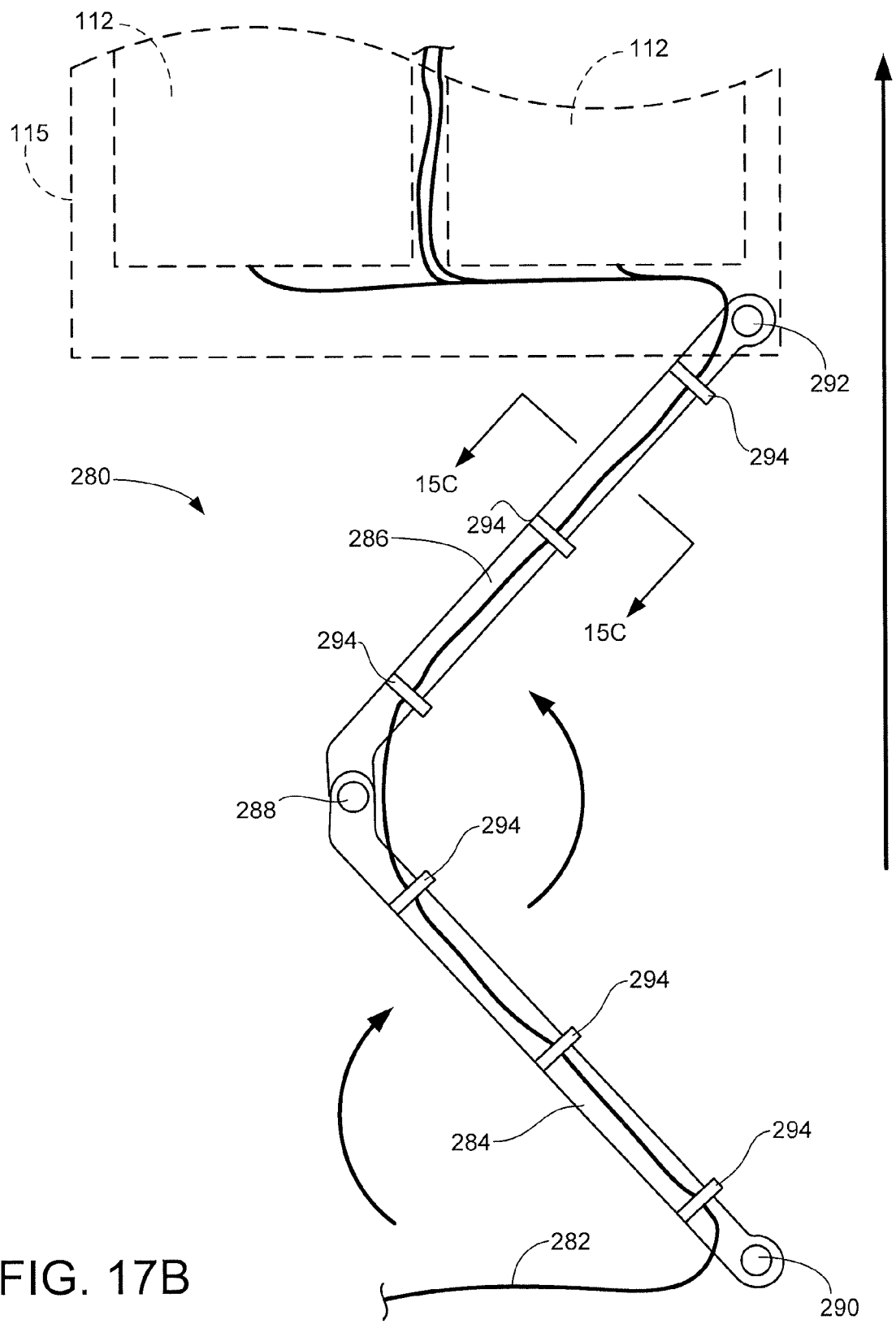

FIGS. 17A-17C illustrate another hinge arm carrier 280 in accordance with some embodiments. The hinge arm carrier 280 is generally similar to the hinge arm carrier 230 in FIGS. 14A-14C. The hinge arm carrier 280 is configured to support a flex circuit 282. The flex circuit 282 may take the form of the flex circuit 260 in FIG. 15, or may take some other form.

The hinge arm carrier 280 includes rigid arms 284, 286 which are connected by an intermediate joint member (elbow joint) 288 so that the arms may rotate relative to one another. A base joint member 290 is secured to the enclosure housing 114 (see e.g., FIG. 2A) and a distal joint member 292 is secured to a selected sled 115 (shown in broken line fashion).

The arms 284, 286 are planar members and include a plurality of securement rings 294 which are spaced along the respective arms 284, 286. As depicted in FIG. 17B, the flex circuit 282 is routed through a central opening 296 in each of the securement rings 294. The opening 296 is larger than the dimensions of the flex circuit 282 to allow the flex circuit to easily slide or otherwise move relative to the arms 284, 286 as the hinge arm carrier 280 transitions between retracted and extended positions. The retracted position is illustrated in FIG. 17A and corresponds to the sled 115 being fully disclosed within the enclosure housing 114 (FIG. 2A), and the extended position is illustrated in FIG. 17B and provides extension of the sled 115 outside the front end 122 of the enclosure housing. While the central opening 296 is rectangular in FIG. 17C, any suitable configuration can be used.

Figure 18:
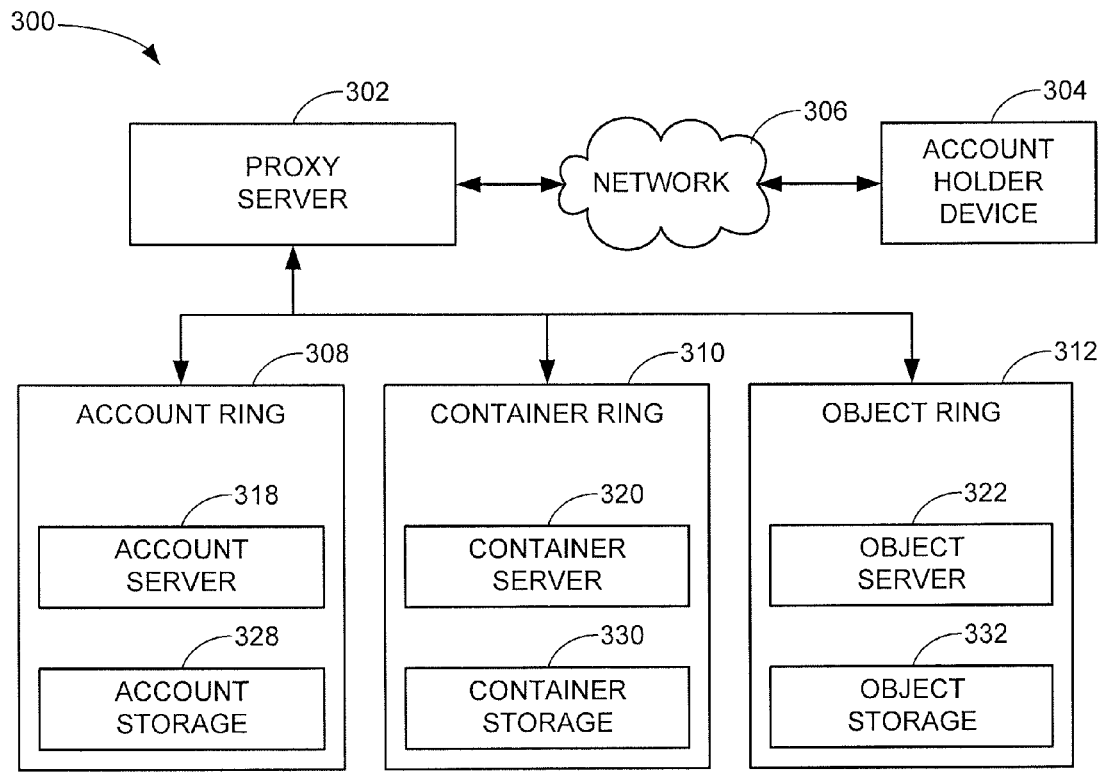
FIG. 18 is a functional block representation of an object storage system in accordance with some embodiments.

FIG. 18 is a functional block representation of a storage system 300 that can be used as an operational environment for the various storage enclosures 110 discussed herein. The storage system 300 is characterized as a distributed object storage system for a cloud computing environment. Other environments can be used.

As will be appreciated by those skilled in the art, storage systems such as 300 can be arranged to store data in the form of accounts, containers and objects. Accounts refer to individual users/entities that store data within the system ("account holders"). Each container is a set of data from a particular account holder arranged in a useful grouping. The individual data sets are referred to as objects. The objects can take a variety of forms such as files or other data sets.

A proxy server 302 communicates with computer based systems of the account holders (account holder devices 304) via a network 306 to store object data in the storage system 300. Data structures are organized as an account ring 308, container ring 310 and object ring 312. Each of these structures have associated physical components including respective account, container and object servers 318, 320 and 322, and respective account, container and object storage 328, 330 and 332. Without limitation, the various server and storage functions can be provided by the storage enclosures 110 discussed herein.

Generally, the account ring 308 provides control information regarding containers, the container ring 310 provides control information regarding objects, and the object ring 312 points to the storage locations of individual objects.

Figure 19:
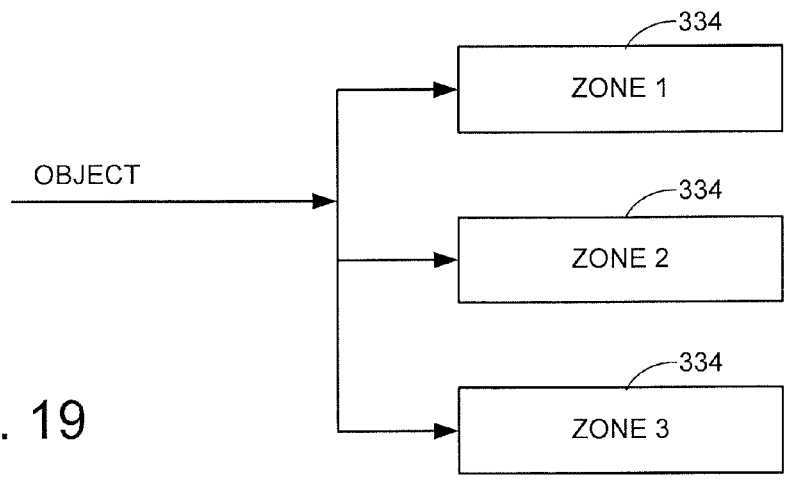
FIG. 19 is a functional representation of object storage in multiple different storage zones in accordance with some embodiments.

All data sets of whatever type are replicated by the system so as to be physically located in different locations (zones). This is exemplified by FIG. 19, which shows the storage of a selected object in three different zones 334 (Zones 1-3). Each zone can take the desired granularity based on system requirements: a zone could be an individual device 112, an individual storage enclosure 110, an individual storage cabinet of enclosures (102 in FIG. 1), a group of storage enclosures, or even a separate data center.

Because of the relatively large amount of overhead processing involved in replication, updating and accessing the individual objects, it can be seen that hot swapping of individual data storage devices 112 while enabling remaining devices 112 within a given storage enclosure 110 to remain active can enhance the overall efficiency and availability of the storage system 300. Thus, the cold-aisle accessibility of the individual storage devices 112 for replacement and rebuild operations as discussed herein can have particularly valuable use in distributed object storage systems such as 300.

Figure 20:
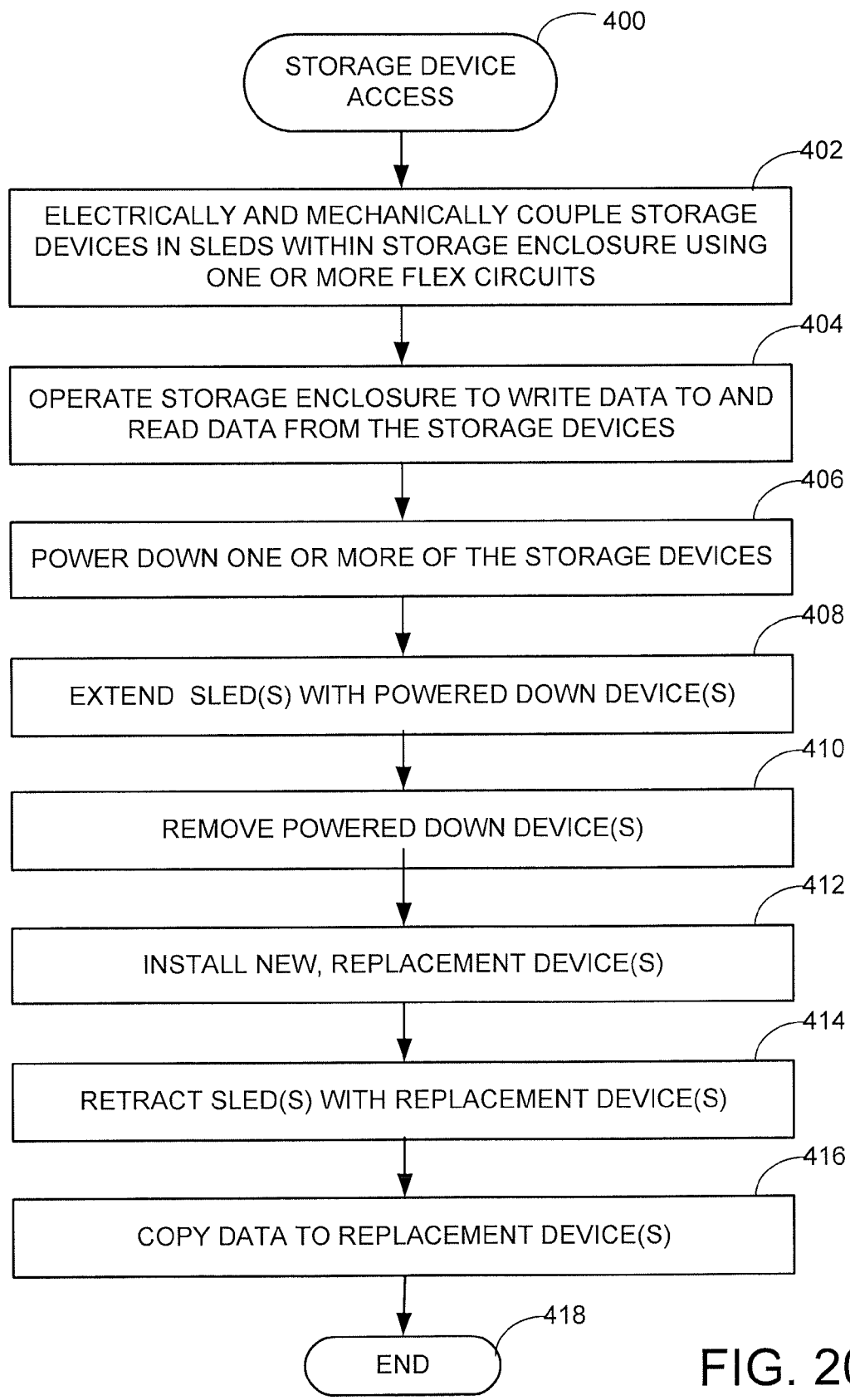
FIG. 20 is a flow chart for a storage device access routine generally illustrative of various embodiments.

FIG. 20 is a flow chart for a STORAGE DEVICE ACCESS routine 400 carried out in accordance with the foregoing discussion. For purposes of illustration, the routine 400 will be discussed using the exemplary storage enclosure 110A of FIG. 2A in an object storage system such as 300.

Initially at step 402, a set of storage devices 112 are electrically and mechanically coupled to sleds 115 within the storage enclosure 110A. The HDDs may be installed onto supports 160 and lowered into associated tray housings 162, and electrical interconnections are made using flex circuits such as in FIGS. 7-9, 14A-C, 17A-C. Step 402 may further include the installation of the storage enclosure 110A into a rack system 102 (see FIG. 1), as well as various initialization steps to add the storage to the storage system 300. The data devices may be configured to accept a variety of data sets, including data objects, during operation of the system 300.

The storage enclosure 110A thereafter enters a period of operational service whereby data are stored to and retrieved from the storage devices 112 as required by the local computer 104 and/or remote host/user devices (not shown) which access the memory space defined by the devices 112 via the network 108.

At some point during the operation of the storage enclosure 110A, one or more of the storage devices will be powered down, as indicated by step 406. This can take place due to a variety of reasons, such as a failure condition being experienced by the device or a commanded power down by a user for replacement/upgrade purposes. A detected imminent failure or reduction in reliability based on monitored parameters may result in the decision to power down and replace the device. It is contemplated albeit not necessarily required that, for each powered down device, one or more of the storage devices in the same sled 115 will remain powered up and remain in an operational mode to continue servicing access operations.

The sled(s) which house the affected device(s) is/are extended at step 408 such as depicted in FIG. 5. This can be carried out automatically such as via a software command from the computer 104, or by user intervention via a retraction button or by the user manually extending the sled(s). Each powered down device 112 is removed from the associated sled 115 at step 410, such as by rotating the device upwardly as depicted in FIGS. 5-7, disconnecting the power/interface connections, and removing the device from the associated support 160.

A replacement device is installed at step 412 by inserting the device into the vacant support 160, attaching the power/interface connections, and lowering the support. The sled is thereafter retracted at step 414 to return the storage enclosure to the condition previously set forth at step 404. As desired, data may be copied over to the new replacement device by the system, step 416, and the routine ends at step 418.

It is contemplated that only one sled will be extended at a time, but the system can accommodate the concurrent extension of multiple adjacent sleds as desired. It will be appreciated that regardless of the flex circuit configuration, each flex circuit will be supplied with sufficient slack length to enable transition of the associated sleds between the extended position and the retracted position while maintaining electrical and mechanical interconnection to each of the storage devices in the associated sled.

The storage enclosures as embodied herein are suitable for use in cloud computing environments as well as a variety of other environments. The use of flex circuits and sleds enhance interior airflow and uniformity of temperature gradients from the cold aisle to the warm aisle side, and facilitate ease of replacement of the individual devices without the need to power down and/or take offline the rest of the storage enclosure.

While various embodiments have been presented in the context of mass storage, such is merely exemplary and is not limiting, as the various enclosures can find applicability in a variety of processing environments.

It is to be understood that even though numerous characteristics and advantages of various embodiments of the present disclosure have been set forth in the foregoing description, together with details of the structure and function of various embodiments thereof, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
an enclosed housing having opposing front and rear ends;
a plurality of sleds disposed within the enclosed housing, each sled having a front end and a rear end, each sled individually moveable between a retracted position within the enclosed housing in which the front end of the sled is nominally aligned with the front end of the enclosed housing and the rear end disposed at a medial portion within the enclosed housing and an extended position in which the sled projects from the front end of the enclosed housing and the rear end of the sled is nominally aligned with the front end of the enclosed housing;
a plurality of data storage devices disposed within the enclosed housing and arranged into multiple groups with each group mechanically supported on a different sled;
a plurality of device flex circuits, each device flex circuit mechanically supported on a different sled to interconnect the associated group of data storage devices supported by said different sled;
a control board disposed within the enclosed housing adjacent the rear end of the enclosed housing; and
a plurality of sled flex circuits disposed within the enclosed housing between the control board and the sleds, each sled flex circuit electrically and mechanically interconnecting the control board to a different one of the device flex circuits; and
a plurality of hinge arm carriers disposed within the enclosed housing between the control board and the sleds, each hinge arm carrier mechanically connected to the rear end of a different one of the sleds to mechanically support the associated sled flex circuit for said different one of the sleds, each hinge arm carrier comprising at least one rigid arm which supports a portion of the associated sled flex circuit along an overall length of the rigid arm and at least one joint member that facilitates articulation of the rigid arm as the selected one of the sleds is advanced from the retracted position to the extended position to maintain the data storage devices supported by the selected one of the sleds in an operational state.

2. The apparatus of claim 1, wherein each sled supports a total number N data storage devices, and each sled further comprises a corresponding number N u-shaped supports with each u-shaped support engaging side portions of a corresponding one of the N data storage devices, each u-shaped support hinged with respect to the associated sled to facilitate rotational movement of the u-shaped support and associated data storage device while maintaining electrical and mechanical interconnection between the associated data storage device and the associated device flex circuit.

3. The apparatus of claim 2, wherein each of the sleds has a first one of the N u-shaped supports that rotates in a clockwise direction from a lowered position to a raised position and a second one of the N u-shaped supports that rotates in a counterclockwise direction from the lowered position to the raised position.

4. The apparatus of claim 1, wherein the at least one rigid arm of each of the hinge arm carriers is characterized as a first arm, and wherein each of the hinge arm carriers further comprises a second rigid arm adapted to support a second portion of the associated sled flex circuit along an overall length of the second rigid arm, the second rigid arm connected to the first arm via an intervening elbow joint member to allow concurrent extension of both the first arm and the second arm as the associated sled is advanced from the retracted position to the extended position.

5. The apparatus of claim 1, wherein each of the plurality of device flex circuits comprise a planar flex circuit comprising a conductive, continuously extending electrical trace supported on a flexible insulative substrate and a connector at a distal end of the planar flex circuit which mechanically engages a connector of the associated data storage device.

6. The apparatus of claim 1, wherein the plurality of device flex circuits each comprise a ribbon cable which terminates at a connector at a distal end of the ribbon cable to mechanically engage a connector of the associated data storage device.

7. The apparatus of claim 1, wherein each of the data storage devices is characterized as a hard disc drive (HDD).

8. The apparatus of claim 1, further comprising at least one fan disposed within the enclosed housing adjacent the rear end of the enclosed housing and configured to draw cooling airflow through the enclosed housing from the front end to the rear end and along the data storage devices on each sled.

9. The apparatus of claim 1, further comprising a power supply within the enclosed housing adjacent the rear end of the enclosed housing to supply electrical power to the plurality of devices via the associated sled flex circuits and device flex circuits.

10. The apparatus of claim 1, characterized as a storage enclosure adapted for mounting in a server rack, the apparatus further comprising a rail system to facilitate sliding extension of the storage enclosure from the server rack in the same direction as the direction of movement of each of the sleds when transitioning in the extended position, the apparatus further comprising an enclosure flex circuit which interconnects to the control board of the storage enclosure adjacent the rear end of the storage enclosure.

11. The apparatus of claim 1, wherein each of the sled flex circuits and each of the device flex circuits is adapted to facilitate the powering off of a selected one of the data storage devices in the associated sled while maintaining a remaining one of the data storage devices in the associated sled in an operational, powered up mode of operation while the sled is in the extended position.

12. The apparatus of claim 1 wherein the enclosed housing has a length dimension, a width dimension and a height dimension, and wherein a longest dimension of the data storage devices in each sled are arranged so as to be aligned with said length and width dimensions.

13. The apparatus of claim 1, wherein the enclosed housing has a length dimension, a width dimension and a height dimension, and wherein a longest dimension of the data storage devices in each sled are arranged so as to be aligned with said length and height dimensions.

14. A storage enclosure adapted to provide storage for an object storage system, the storage enclosure comprising:
- a rectilinear housing configured for installation into a cabinet between a cold aisle and a warm aisle, the housing having opposing top and bottom planar surfaces, opposing side surfaces, a front surface in facing relation to the cold aisle and a rear surface in facing relation to the warm aisle;
- a plurality of sleds operatively coupled to the housing, each sled adapted for sliding movement relative to the housing between a retracted position within an interior of the housing and an extended position in which the sled extends through an opening in the front surface of the housing in a direction toward the cold aisle, the sleds arranged in respective rows and columns to substantially occupy a first portion of the housing adjacent the cold aisle;
- a plurality of data storage devices supported within each of the plurality of sleds;
- a plurality of device flex circuits each supported by a corresponding one of the sleds and configured to interconnect the corresponding data storage devices of said corresponding one of the sleds;
- a control board disposed within a second portion of the housing adjacent the warm aisle, the control board supporting a controller circuit comprising a programmable processor and local memory; and
- a plurality of sled flex circuits disposed within the enclosed housing between the control board and the sleds, each sled flex circuit electrically and mechanically interconnecting the control board to a different one of the device flex circuits, each of the sled flex circuits having sufficient slack length to enable transition of the associated sled between the extended position and the retracted position while remaining contactingly engaged with each of the data storage devices in the associated sled so that a first data storage device in the associated sled can be powered off while maintaining a second data storage device in the associated sled in a powered on, operative condition to service data transfer commands from a host; and
- a plurality of hinge arm carriers disposed within the enclosed housing between the control board and the sleds, each hinge arm carrier mechanically connected to the rear end of a different one of the sleds to mechanically support the associated sled flex circuit for said different one of the sleds, each hinge arm carrier comprising at least one rigid arm which supports a portion of the associated sled flex circuit along an overall length of the rigid arm and at least one joint member that facilitates articulation of the rigid arm as the selected one of the sleds is advanced from the retracted position to the extended position.

15. The storage enclosure of claim 14, wherein each sled supports a total number N data storage devices, and each sled further comprises a corresponding number N u-shaped supports with each u-shaped support engaging side portions of a corresponding one of the N data storage devices, each u-shaped support hinged with respect to the associated sled to facilitate rotational movement of the u-shaped support and associated data storage device while maintaining electrical and mechanical interconnection between the associated data storage device and the associated device flex circuit.

16. The storage enclosure of claim 15, wherein each of the sleds has a first one of the N u-shaped supports that rotates in a clockwise direction from a lowered position to a raised position and a second one of the N u-shaped supports that rotates in a counterclockwise direction from the lowered position to the raised position.

17. The storage enclosure of claim 14, wherein the at least one rigid arm of each of the hinge arm carriers is characterized as a first arm, and wherein each of the hinge arm carriers further comprises a second rigid arm adapted to support a second portion of the associated sled flex circuit along an overall length of the second rigid arm, the second rigid arm connected to the first arm via an intervening elbow joint member to allow concurrent extension of both the first arm and the second arm as the associated sled is advanced from the retracted position to the extended position.

18. The storage enclosure of claim 14, wherein each of the plurality of device flex circuits comprise a planar flex circuit comprising a conductive, continuously extending electrical trace supported on a flexible insulative substrate and a connector at a distal end of the planar flex circuit which mechanically engages a connector of the associated data storage device.

19. The storage enclosure of claim 14, wherein the plurality of device flex circuits each comprise a ribbon cable which terminates at a connector at a distal end of the ribbon cable to mechanically engage a connector of the associated data storage device.

20. The storage enclosure of claim 14, wherein the data storage devices are characterized as hard disc drives (HDDs).

* * * * *